United States Patent
Hutton

(10) Patent No.: US 8,020,027 B1
(45) Date of Patent: Sep. 13, 2011

(54) TIMING CONTROL IN A SPECIALIZED PROCESSING BLOCK

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 744 days.

(21) Appl. No.: 12/049,560

(22) Filed: Mar. 17, 2008

(51) Int. Cl.
*G06F 1/04* (2006.01)
*G05F 5/06* (2006.01)
*H03L 7/00* (2006.01)

(52) U.S. Cl. ........ 713/601; 713/500; 713/501; 327/161; 327/291; 327/298

(58) Field of Classification Search .................. 713/500, 713/501, 601; 327/161, 291, 298
See application file for complete search history.

(56) References Cited

U.S. PATENT DOCUMENTS

| 7,288,979 | B2 * | 10/2007 | Yoneda | 327/291 |
| 7,319,619 | B1 * | 1/2008 | Choe | 365/189.05 |
| 7,545,196 | B1 | 6/2009 | Hutton et al. | |
| 7,818,705 | B1 | 10/2010 | Hutton et al. | |
| 2003/0026367 | A1 * | 2/2003 | Denny et al. | 375/354 |
| 2008/0129357 | A1 * | 6/2008 | Chlipala et al. | 327/161 |
| 2008/0222471 | A1 * | 9/2008 | Sul et al. | 714/731 |
| 2009/0160519 | A1 * | 6/2009 | Keskin et al. | 327/261 |

* cited by examiner

*Primary Examiner* — Vincent T Tran
(74) *Attorney, Agent, or Firm* — Ropes & Gray LLP; Jeffrey H. Ingerman

(57) ABSTRACT

The tension between $f_{max}$ and $T_{co}$ in a specialized processing block of a programmable integrated circuit device can be reduced by providing variable delays on the clock inputs of the pipeline registers within the specialized processing block. This allows the introduction of beneficial skew that allows slower functions to be performed within the specialized processing block rather than outside the block, thereby reducing $T_{co}$, without slowing down the clock—i.e., without reducing $f_{max}$. This technique may also apply to other specialized blocks such as memory.

15 Claims, 4 Drawing Sheets

TIMING CONTROL IN A SPECIALIZED PROCESSING BLOCK

BACKGROUND OF THE INVENTION

This invention relates to control of clock-to-output time in a specialized processing block, particularly in a programmable integrated circuit device such as, e.g., a programmable logic device (PLD).

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, PLDs sold by Altera Corporation, of San c) Jose, Calif., as part of the STRATIX® family, include DSP blocks, each of which may include four 18-by-18 multipliers. Each of those DSP blocks also may include adders and registers, as well as programmable connectors (e.g., multiplexers) that allow the various components to be configured in different ways.

In each such block, there are competing timing constraints. Normally, a user would like to be able to operate the block, along with the device of which it is a part, at the highest possible clock speed. However, the speed of each component within the block may limit the amount that can be accomplished within each clock cycle. For example, in the aforementioned example, if the multipliers are designed to operate at a certain speed, but the adders are slower, then any function that requires use of both components can operate at a maximum clock speed determined by the slower component.

One way to lessen the effects of the slower components is to use the registers in the block to pipeline the function to be performed. Thus, if two successive components cannot complete their operations on a particular datum within the same clock cycle, by the use of registers between the components, they can be divided between clock cycles, so that only one component need complete operation in any one clock cycle. This is of value in cases where the speed of the bottleneck component is fast compared to the maximum device clock but not fast enough to be combined with another component within a single clock cycle. If the bottleneck component is slow compared to the maximum system clock, then pipelining will not help because the device clock still will have to be slowed down to the speed of the bottleneck component.

In any event, pipelining has its own drawbacks even where it may be helpful. Pipelining introduces latency, in that the final result of the pipelined process is delayed by one clock cycle per added pipeline stage—the device can operate at the desired clock rate, but the number of clock cycles until the result is provided increases. Once the first result is provided, subsequent results will continue to flow, and for some applications, such as playback of recorded media, this may be sufficient. However, for other applications, such as real-time audio or video communications, latency may be unacceptable.

Alternatives, such as moving slower functions outside the specialized processing block where they are not subject to the timing constraints within the block, may increase the time-from-clock-to-output ($T_{co}$)—i.e., the time from the clock on which the block output is completed until the output reaches the first unregistered destination outside the block—because additional time is needed for the post-block processing, sacrificing $T_{co}$ for clock speed, or "$f_{max}$".

SUMMARY OF THE INVENTION

The present invention reduces the tension between $f_{max}$ and $T_{co}$ in a specialized block by providing variable delays on the clock inputs of the pipeline registers within the specialized block. This allows the introduction of beneficial skew that allows slower functions to be performed within the specialized block rather than outside the block, thereby reducing $T_{co}$, without slowing down the clock—i.e., without reducing $f_{max}$. The invention may apply to specialized processing blocks as described above (e.g., DSP blocks), as well as to other specialized blocks (e.g., memory).

Thus, in accordance with the present invention, there is provided a specialized block in a programmable integrated circuit device. The specialized block includes a plurality of function elements arranged in a pipeline with a plurality of pipeline registers, a clock conductor providing a clock to the pipeline registers, a respective delay associated with each respective one of at least one of the pipeline registers, and a respective selector associated with each respective delay. Each respective selector selectably connects one of (a) the clock, and (b) the clock delayed by a respective delay, to the respective one of said least one of the pipeline registers.

A method of configuring timing of such a specialized block, and software for carrying out that method, also are provided.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which.

DETAILED DESCRIPTION

As described above, design of a specialized block, including register placement, inherently trades off $f_{max}$ and $T_{co}$. In different modes, the critical path may lie in different pipeline stages in the block. However, the design of the pipeline is fixed at the time of fabrication. In a fixed device, the remainder of the device configuration also is known at that time, and therefore one can determine whether $f_{max}$ or $T_{co}$ is more important and design the block accordingly. However, in a programmable device, where each user's needs will be different, it generally is not possible to know ahead of time whether $f_{max}$ or $T_{co}$ is more critical. In accordance with the present invention, introduction of programmable delays on the clock inputs of pipeline registers inside specialized blocks allows the user to choose, in programming the device, how to trade off $f_{max}$ for $T_{co}$, or vice-versa, based on the user logic design's critical path and timing constraints. This may even allow components or memories to effectively run faster in a pipeline than their actual electrical speed, as described below.

Figure 1:
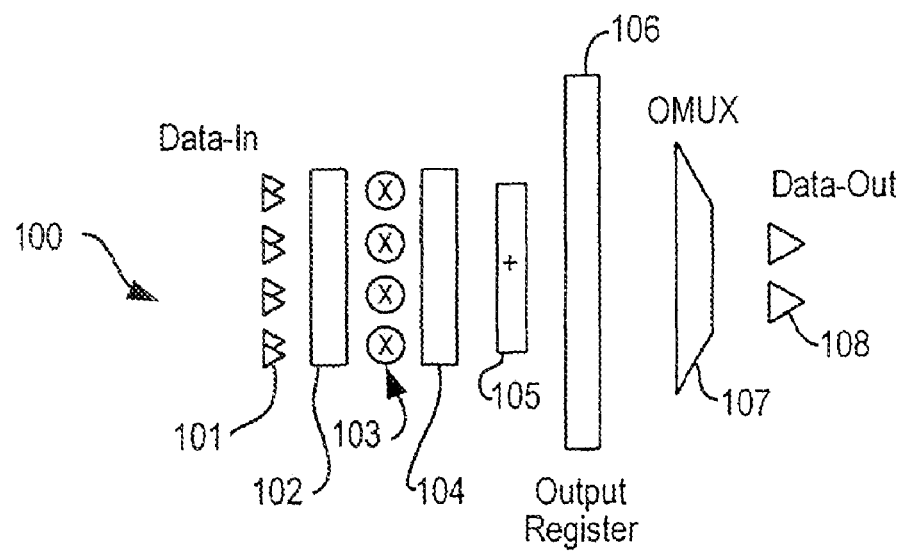
FIG. 1 is a schematic representation of a known fundamental processing unit of a specialized processing block with which the invention may be used.

The problem to be solved may be considered, by way of example only and not by way of limitation, in connection with the STRATIX® III programmable logic device available from Altera Corporation, of San Jose, Calif., which includes a specialized processing block for, inter alia, DSP functions. FIG. 1 shows a schematic view of a fundamental processing unit 100 of that specialized processing block. From left to right in FIG. 1, the data input buffers 101 feed the input register 102, a set of 18-bit-by-18-bit multipliers 103, a pipeline register 104, an internal adder 105 and an output register 106. Output register 106 may be wider than the total number of data outputs of the block, so based on the user-defined operating mode, output multiplexer (OMUX) 107 selects appropriate outputs 108 to feed signal conductors in the output region of the block. Each of registers 102, 104, 106 may be bypassed under user control. For example, for any one register, a user-programmable multiplexer (not shown) may select between a path through that register or a bypass conductor (not shown).

The specialized processing block represented by fundamental processing unit 100 may be configured to implement one of many different functions. For example, the block may be configured as four independent 9-bit-by-9-bit multipliers with any combination of pipelining registers, as two independent 18-bit-by-18-bit multipliers with any combination of pipelining registers, or as the sum of four 18-bit-by-18-bit multipliers with any combination of pipelining registers. Additionally, a post-adder 201 (see FIG. 2) can be used to optionally chain the outputs of the multiple adders 105 of a plurality of specialized processing blocks.

In each of these configurations, the timing paths between different registers may vary. For example, a fully pipelined 18-bit-by-18-bit multiplication may run at 550 MHz. If pipeline register 104 is bypassed, a 2.436 ns delay may be introduced, lowering the speed to 410 MHz. Moreover, if adder 105 is used, fundamental processing unit 100 may run at only 480 MHz; for the multiplication to run at 550 MHz, adder 105 would have to be bypassed and an adder implemented in programmable logic externally of the specialized processing block.

Figure 2:
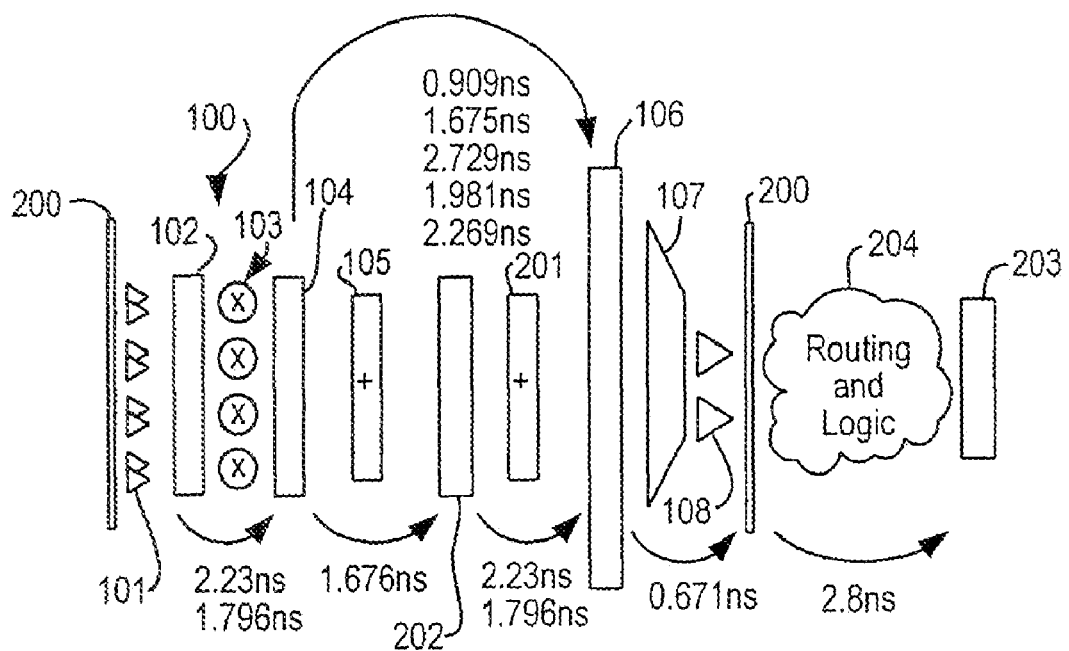
FIG. 2 is a schematic representation of a portion of a programmable integrated circuit device incorporating a specialized processing block based on the fundamental processing unit of FIG. 1.

FIG. 2 is similar to FIG. 1, with the addition of representations of boundaries 200 of the specialized processing block of which fundamental processing unit 100 is a part, additional in-block adder 201 (which may be referred to as a "post-adder") and accompanying additional pipeline register 202, external register 203, a generic representation 204 of routing and general-purpose logic of the device of which the specialized processing block is a part, and representative timing paths for various stages.

As can be seen, for some stages, more than one representative delay is shown, because in those stages the various delays that affect both $f_{max}$ and $T_{co}$ may vary considerably. These variations may depend on how the user configures the block. For example, multiplier delay may depend on the multiplier size. Delay from pipeline register 104 to the output register 106 is shown to vary considerably (five different representative delays are shown), depending on the modes used including, but not limited to, the length of adder 105, whether rounding, saturation, etc. are turned on, the use of a logical shifter (for ALUs) and the use of dynamic modes.

Although the output multiplexer delay is shown as a constant, that constant typically is chosen to maximize $f_{max}$. As a result, the $T_{co}$ path may be compromised by the amount of multiplexer logic (e.g., 671 ps). This reflects the tension in the architecture of such specialized processing blocks. A design that optimizes the maximum throughput of one mode—such as an independent 18-bit-by-18-bit pipelined multiplication in the block of FIGS. 1 and 2—is not necessarily the best design for other modes.

The reason for this is that the critical path may be in a different pipeline stage depending on the mode and the user design's other logic. In the case of a heavily pipelined system with the aforementioned external adder, the critical path may be multipliers 103 at 550 MHz. However, in the case of a design that has no external adder, because the additional latency resulting from pipelining such an adder cannot be incurred, the critical path may be the $T_{co}$ path from register 106, through output multiplexer 107 and the external adder (not shown), to external register 203.

Copending, commonly-assigned U.S. patent application Ser. No. 11/102,069, filed Apr. 8, 2005, which is hereby incorporated by reference herein in its entirety, describes the insertion of programmable delay into switching multiplexers in the global clock network of a programmable logic device, to achieve beneficial skew without the need for clock generation by phase-locked loops, along with several methods to generate such programmable delays. In addition, copending, commonly-assigned U.S. patent application Ser. No. 11/550,132 describes clock selection in a specialized processing block of the type described above, in which a user can generate a shifted clock using a phase-locked loop, and that shifted clock can be used within the specialized processing block to adjust timing within the block.

The techniques disclosed in the aforementioned prior applications could be combined to provide a solution to the timing difficulties described above, provided that the user is prepared to use the additional general-purpose programmable logic of the programmable logic device, including a phase-locked loop (assuming that the user's logic design for the programmable logic device as a whole did not already consume all of the available phase-locked loops).

In accordance with the present invention, the aforementioned timing difficulties can be solved without resort to substantial amounts of logic outside the specialized processing block. This is accomplished by providing one or more programmable clock delays in the specialized processing block, allowing a user to programmably modify the internal clock paths of the specialized processing block to introduce beneficial skew at one or more locations as determined by the user logic design of the device of which the block is a part.

Figure 3:
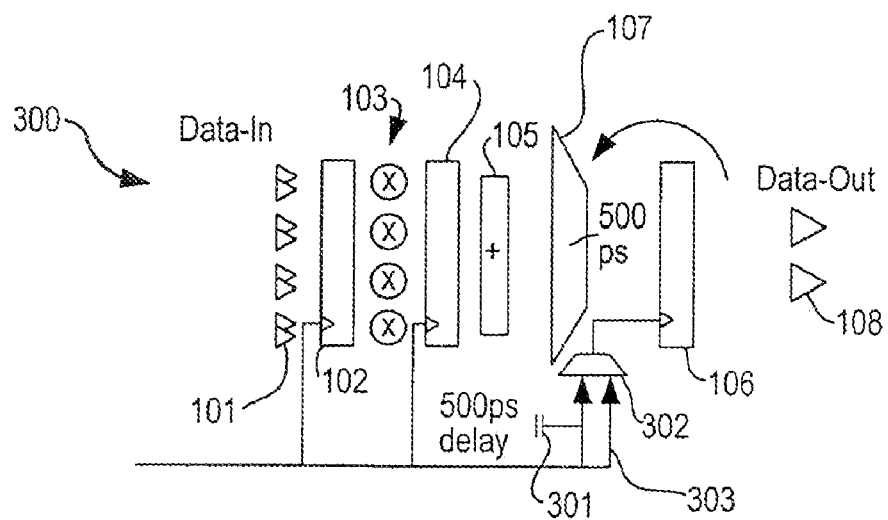
FIG. 3 is a schematic representation of a fundamental processing unit similar to that of FIG. 1, modified in accordance with an embodiment of the present invention.

FIG. 3 shows a modified fundamental processing unit 300 based on fundamental processing unit 100 of FIG. 2, modified in accordance with an embodiment of the present invention, which may be included in a specialized processing block. More generally, FIG. 3 may be thought of as a simplified representation of a specialized processing block in accordance with the invention.

In fundamental processing unit/specialized processing block 300, output multiplexer 107 is located upstream of output register 106, which may add, e.g., about 500 ps of delay to the internal adder 105. A delay 301 is provided at the clock input of output register 106. Multiplexer 302 allows selection of undelayed clock 303, or the clock as delayed by delay 301. The amount of skew introduced by delay 301 may be fixed or may be programmable.

In one embodiment, in which the multipliers are optimized for 550 MHz operation, the amount of skew introduced by delay 301 may be set to substantially match and counterbalance the delay added by moving output multiplexer 107. When the delayed or skewed clock 301 is selected, the resulting beneficial skew allows the block to behave as though output multiplexer 107 were downstream of output register 106 as in FIGS. 1 and 2, allowing use of the high-performance multipliers 103 at their maximum rated speed.

However, when the user logic design calls for the block to run slower (e.g., about 400 MHz), and the critical path is in the $T_{co}$ logic, such as the case where there is an external unpipelined adder or an adder tree following internal adder 105, the unskewed clock may be selected, in which case the 500 ps delay introduced by locating output multiplexer 106 upstream of output register 107 is absorbed into the slack of adder 105 (slack exists when the pipeline needs only to run at lower speeds such as 400 MHz), while the external devices get the benefit of the shorter $T_{co}$ path.

Figure 4:
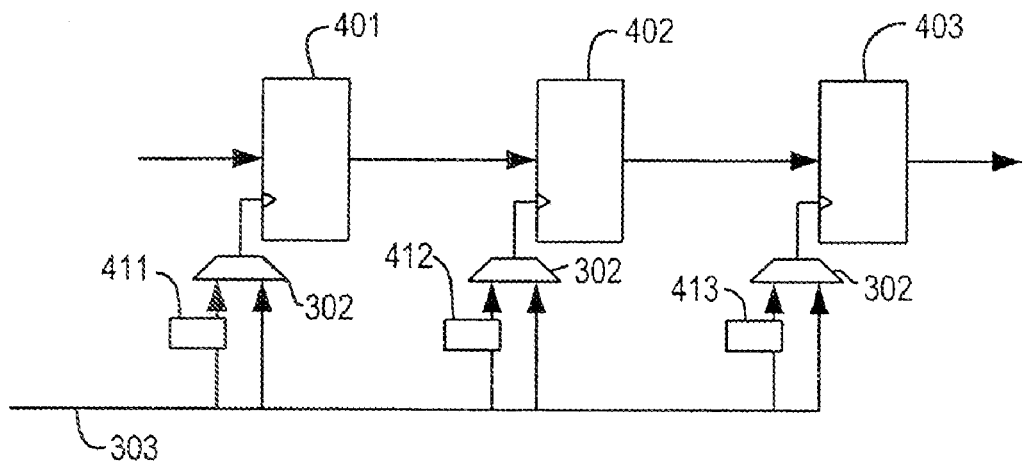
FIG. 4 is a partial representation of a generic processing block in accordance with an embodiment of the present invention.

More generally, as shown in FIG. 4, where a plurality of stages are represented by registers 401, 402, 403, each stage can be provided with a programmable clock delay 411, 412, 413 to maximize performance. The values of all delays 411-413 could be made the same, or the value of each delay 411, 412, 413 could be tailored to the operating characteristics of the respective stage, or the delays 411-413 could be adjustable either continuously or to a number of preset values.

In a simple example, assume that the undelayed system clock 410 is running at 100 MHz, which represents a clock period of 10 ns. Therefore, the operations within each stage 401-403 would have to complete within 10 ns to maintain the timing. Suppose, however, that the operations in stage 401 could not be completed in less than 12 ns, but the operations in stage 402 could be completed in 8 ns or less. If delay 412 were set to 2 ns and selected, a second clock pulse would not reach stage 402 until 12 ns after a first clock pulse reached stage 401, giving stage 401 12 ns to complete operations. A third undelayed clock pulse would still reach stage 403 20 ns after the first clock pulse, which is only 8 ns after the second clock pulse reached stage 402, but stage 402 is capable of completing operations within 8 ns, and so the results from stage 402 will arrive at stage 403 in time for the third clock pulse. In this case, which may be considered the opposite of the example shown in FIG. 3, stage 401 has "borrowed" or "stolen" 2 ns of beneficial skew from stage 402.

This invention can be used for any type of fixed block in a programmable integrated circuit device, whether the fixed block is memory, a DSP block, or any other kind of specialized block.

Design or synthesis software can be made to take advantage of the invention, by moving components and registers around relative to one another (similar to register packing) and providing programmably delayable clocks accordingly, to meet the timing constraints of a user logic design, even if the user has not specified such an arrangement.

Such software can be embodied in instructions for carrying out the method according to this invention, which may be encoded on a machine-readable medium, to be executed by a suitable computer or similar device to implement the method of the invention for programming or configuring programmable integrated circuit devices as described above. For example, a personal computer may be equipped with an interface to which a programmable integrated circuit device can be connected, and the personal computer can be used by a user to program the programmable integrated circuit device using a suitable c) software tool, such as the QUARTUS® II software available from Altera Corporation, of San Jose, Calif.

Figure 5:
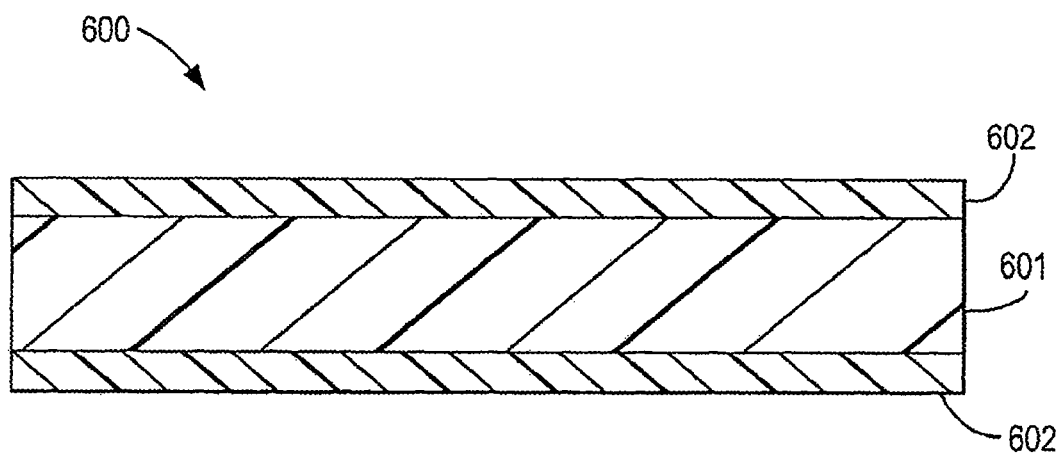
FIG. 5 is a cross-sectional view of a magnetic data storage medium which may be encoded with a set of machine executable instructions for performing a method according to the present invention.

FIG. 5 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 6:
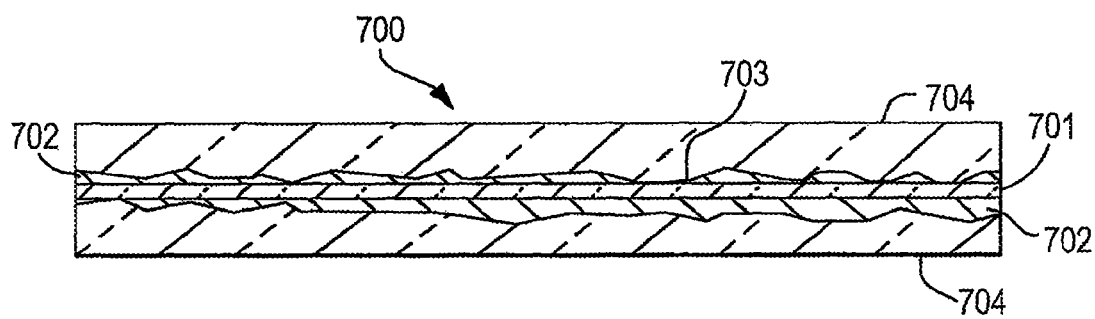
FIG. 6 is a cross-sectional view of an optically readable data storage medium which may be encoded with a set of machine executable instructions for performing the method according to the present invention.

FIG. 6 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

Thus it is seen that a structure and a technique for accommodating competing timing considerations in pipelined structures in a programmable integrated circuit device, a programmable integrated circuit device so programmed, and software for carrying out the programming, have been provided.

Figure 7:
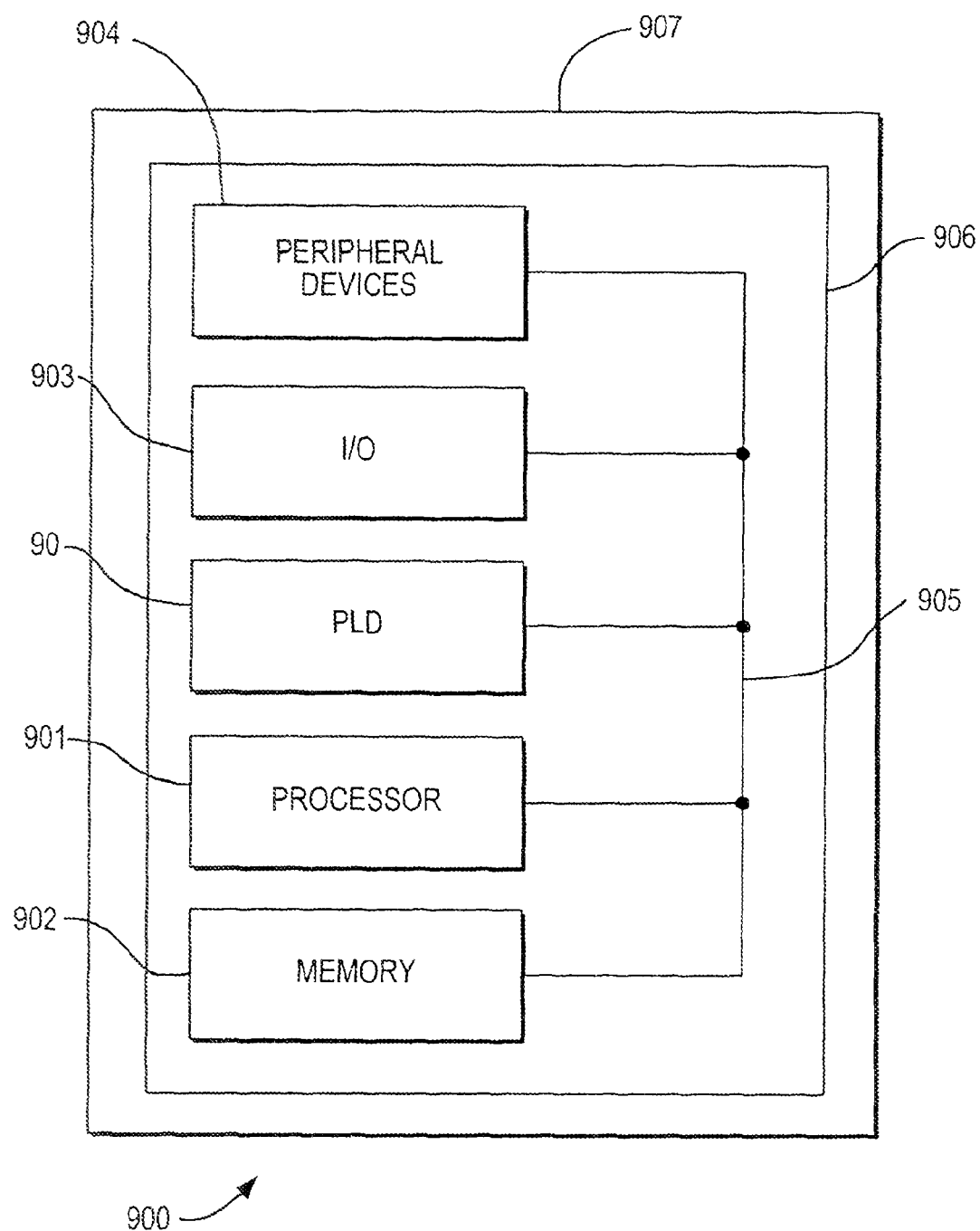
FIG. 7 is a simplified block diagram of an illustrative system employing a programmable logic device incorporating the present invention.

A PLD 90 programmed according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a programmable integrated circuit device in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A specialized block in a programmable integrated circuit device, said specialized block comprising:
 a plurality of function elements arranged in a pipeline with a plurality of pipeline registers;
 a clock conductor providing a clock signal to said pipeline registers;
 a respective programmable delay associated with each respective one of at least one of said pipeline registers; and
 a respective selector associated with each said respective pipeline register, each said respective selector having as inputs (a) said clock signal, and (b) said clock signal delayed by said respective programmable delay; whereby:
 said respective selector selectably connects one of (a) said clock signal, and (b) said clock signal delayed by said respective programmable delay, to said respective one of said least one of said pipeline registers.

2. The specialized block of claim 1 wherein said respective delay is continuously adjustable within a range of delays.

3. The specialized block of claim 1 wherein said respective delay is adjustable to one of a plurality of preset delays.

4. The specialized block of claim 1 wherein said functional elements are digital signal processing components.

5. The specialized block of claim 1 wherein said functional elements are memory components.

6. A method of configuring timing of a specialized block in a programmable integrated circuit device, said specialized block including a plurality of function elements arranged in a pipeline with a plurality of pipeline registers, a clock conductor providing a clock signal to said pipeline registers, a respective programmable delay associated with each respective one of at least one of said pipeline registers, and a respective selector associated with each said respective pipeline register, said method comprising:
 configuring said functional elements relative to said registers in accordance with constraints of said timing;
 configuring said clock conductor and each said respective programmable delay as inputs to each said respective selector; and
 configuring each said respective selector to select one of (a) said clock signal, and (b) said clock signal delayed by said respective programmable delay, according to said configuring of said functional elements relative to said registers.

7. The method of claim 6 wherein said configuring said functional elements relative to said registers comprises:
 configuring a functional element before one of said registers; and
 configuring one of said respective selectors associated with said one of said registers to select said delayed clock signal.

8. The method of claim 6 wherein said configuring said functional elements relative to said registers comprises configuring logic of said programmable integrated circuit device outside said specialized block to perform functions of one of said functional elements of said specialized block.

9. The method of claim 8 wherein said configuring logic of said programmable integrated circuit device outside said specialized block to perform functions of one of said functional elements of said specialized block comprises configuring said logic of said programmable integrated circuit device outside said specialized block to perform said functions of one of said functional elements of said specialized block in place of said one of said functional elements of said specialized block.

10. The method of claim 8 wherein said configuring logic of said programmable integrated circuit device outside said specialized block to perform functions of one of said functional elements of said specialized block comprises configuring said logic of said programmable integrated circuit device outside said specialized block to perform said functions of one of said functional elements of said specialized block in addition to said one of said functional elements of said specialized block.

11. A machine-readable data storage medium encoded with machine-executable instructions for configuring timing of a specialized block in a programmable integrated circuit device, said specialized block including a plurality of function elements arranged in a pipeline with a plurality of pipeline registers, a clock conductor providing a clock signal to said pipeline registers, a respective programmable delay associated with each respective one of at least one of said pipeline registers, and a respective selector associated with each said respective pipeline register, said instructions comprising:

instructions to configure said functional elements relative to said registers in accordance with constraints of said timing;

instructions to configure said clock conductor and each said respective programmable delay as inputs to each said respective selector; and instructions to configure each said respective selector to select one of (a) said clock signal, and (b) said clock signal delayed by said respective programmable delay, according to said configuring of said functional elements relative to said registers.

12. The machine-readable data storage medium of claim 11 wherein said instructions to configure said functional elements relative to said registers comprise:

instructions to configure a functional element before one of said registers; and instructions to configure one of said respective selectors associated with said one of said registers to select said delayed clock signal.

13. The machine-readable data storage medium of claim 11 wherein said instructions to configure said functional elements relative to said registers comprise instructions to configure logic of said programmable integrated circuit device outside said specialized block to perform functions of one of said functional elements of said specialized block.

14. The machine-readable data storage medium of claim 13 wherein said instructions to configure said logic of said programmable integrated circuit device outside said specialized block to perform said functions of one of said functional elements of said specialized block comprise instructions to configure said logic of said programmable integrated circuit device outside said specialized block to perform said functions of one of said functional elements of said specialized block in place of said one of said functional elements of said specialized block.

15. The machine-readable data storage medium of claim 13 wherein said instructions to configure said logic of said programmable integrated circuit device outside said specialized block to perform said functions of one of said functional elements of said specialized block comprise instructions to configure said logic of said programmable integrated circuit device outside said specialized block to perform said functions of one of said functional elements of said specialized block in addition to said one of said functional elements of said specialized block.

\* \* \* \* \*